(12) United States Patent
Tosiya (10) Patent No.: US 7,378,764 B2
(45) Date of Patent: May 27, 2008

(54) POSITIONING APPARATUS, EXPOSURE APPARATUS USING THEREOF AND DEVICE MANUFACTURING METHOD

(75) Inventor: Asano Tosiya, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 63 days.

(21) Appl. No.: 11/264,881

(22) Filed: Nov. 1, 2005

(65) Prior Publication Data

US 2006/0097585 A1    May 11, 2006

(30) Foreign Application Priority Data

Nov. 8, 2004   (JP) .............................. 2004-323759

(51) Int. Cl.
*H20K 41/00* (2006.01)
(52) U.S. Cl. .......................... 310/12; 310/15
(58) Field of Classification Search .................. 310/12, 310/15
See application file for complete search history.

(56) References Cited

U.S. PATENT DOCUMENTS

| | | | | |
|---|---|---|---|---|
| 6,208,045 B1 * | 3/2001 | Hazelton et al. | ............... | 310/12 |
| 7,075,197 B2 * | 7/2006 | Korenaga | ..................... | 310/12 |
| 2003/0052548 A1 * | 3/2003 | Hol et al. | ..................... | 310/12 |
| 2004/0126907 A1 | 7/2004 | Korenaga | | |
| 2005/0140215 A1 * | 6/2005 | Korenaga | ..................... | 310/12 |
| 2005/0194843 A1 * | 9/2005 | Korenaga | ..................... | 310/12 |

FOREIGN PATENT DOCUMENTS

JP    2004-254489 A    9/2004

\* cited by examiner

*Primary Examiner*—Darren Schuberg
*Assistant Examiner*—Iraj Mohandesi
(74) *Attorney, Agent, or Firm*—Canon U.S.A. Inc., IP Division (57) ABSTRACT

A positioning apparatus including a movable member having a plurality of magnets, and a plurality of coils arranged in X- and Y-axial directions, for displacing the movable member in the X- and Y-axial directions, and in a rotational direction around the Z-axis.

6 Claims, 9 Drawing Sheets

POSITIONING APPARATUS, EXPOSURE APPARATUS USING THEREOF AND DEVICE MANUFACTURING METHOD

BACKGROUND OF THE INVENTION

1. Field of the Invention

The present invention relates to a positioning apparatus, and in particular, though not exclusively, to a positioning apparatus used in an exposure apparatus and/or survey equipment.

2. Description of the Related Art

A conventional exposure apparatus can have a positioning apparatus for positioning a wafer or a reticle. Japanese Patent Laid-Open No. 2004-254489 discusses a stage unit using a surface motor, as a wafer stage, for positioning a wafer.

Figure 8A:
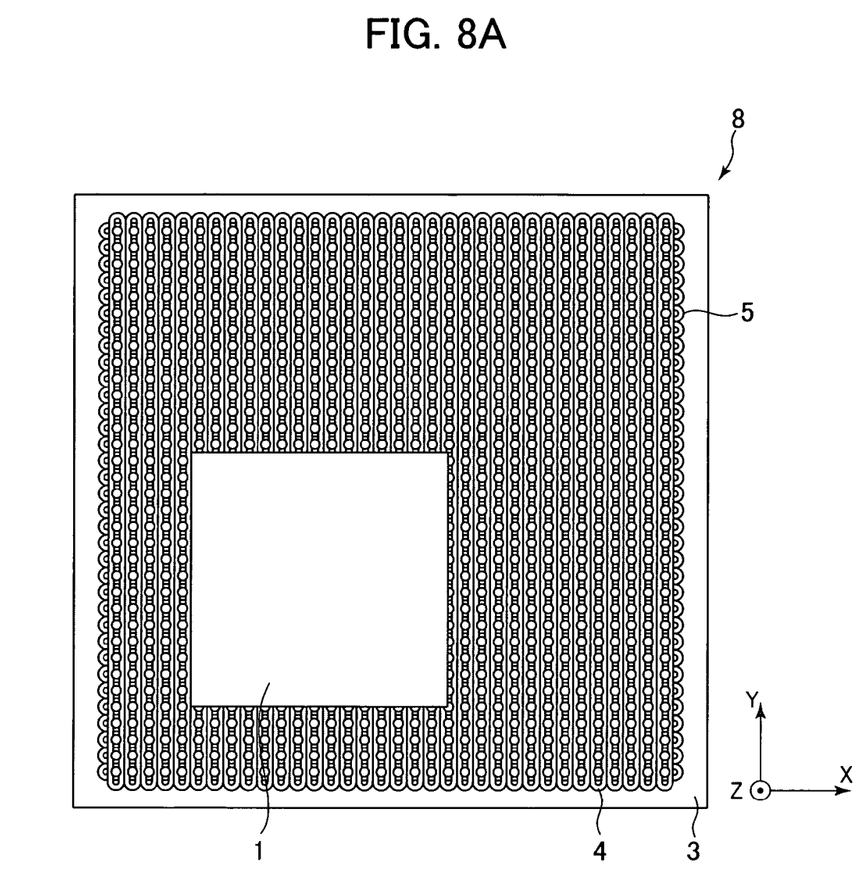
FIG. 8A is a top view illustrating a surface motor type wafer stage.
Figure 8B:
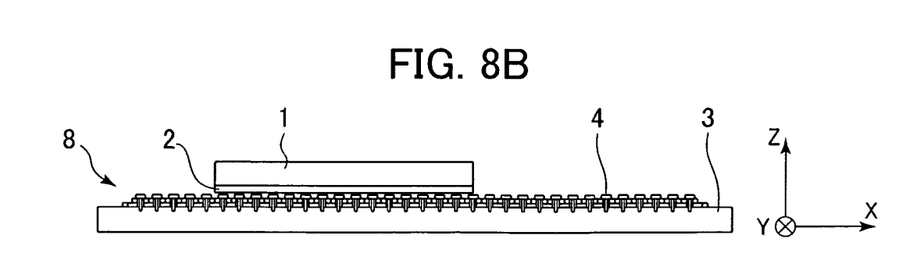
FIG. 8B is a sectional view illustrating the surface motor type wafer stage shown in FIG. 8A.

FIG. 8A illustrates a top view which shows the wafer stage 8 discussed in Japanese Patent Laid-Open No. 2004-254489, and FIG. 8B illustrates a sectional view which shows the wafer stage 8 as viewed sidewise.

Referring to these figures, a movable member 1 (stage) includes a magnet unit 2 in which permanent magnets are arranged in the so-called Halbach array at its bottom surface, and a base member 3, which has a coil unit 4 in which a plurality of coils are arranged. Magnetic fluxes generated from these permanent magnets and currents fed to the coils produce a Lorentz's force by which the movable member 1 is displaced.

Figure 9A:
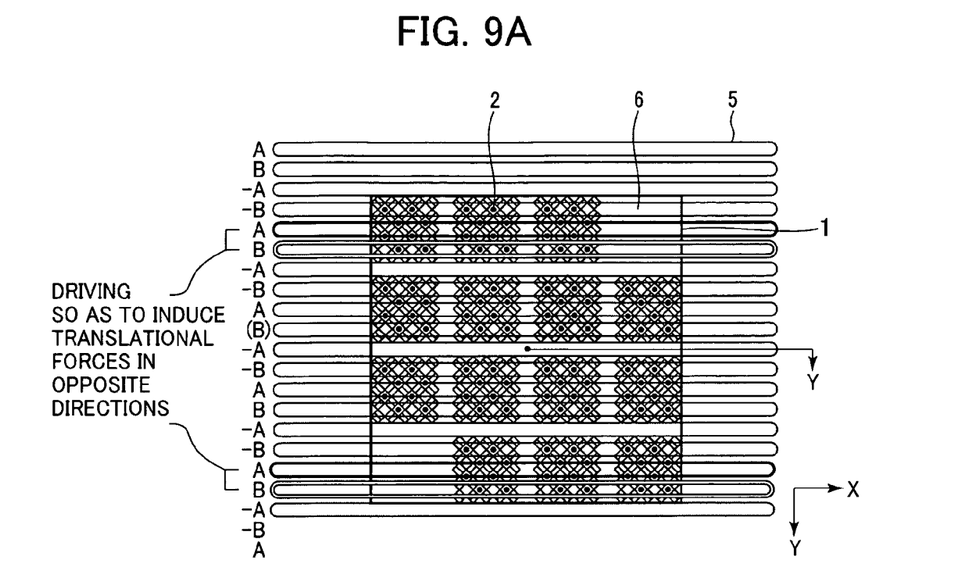
FIGS. 9A and 9B are views illustrating magnet configurations of conventional surface motor type wafer stages.
Figure 9B:
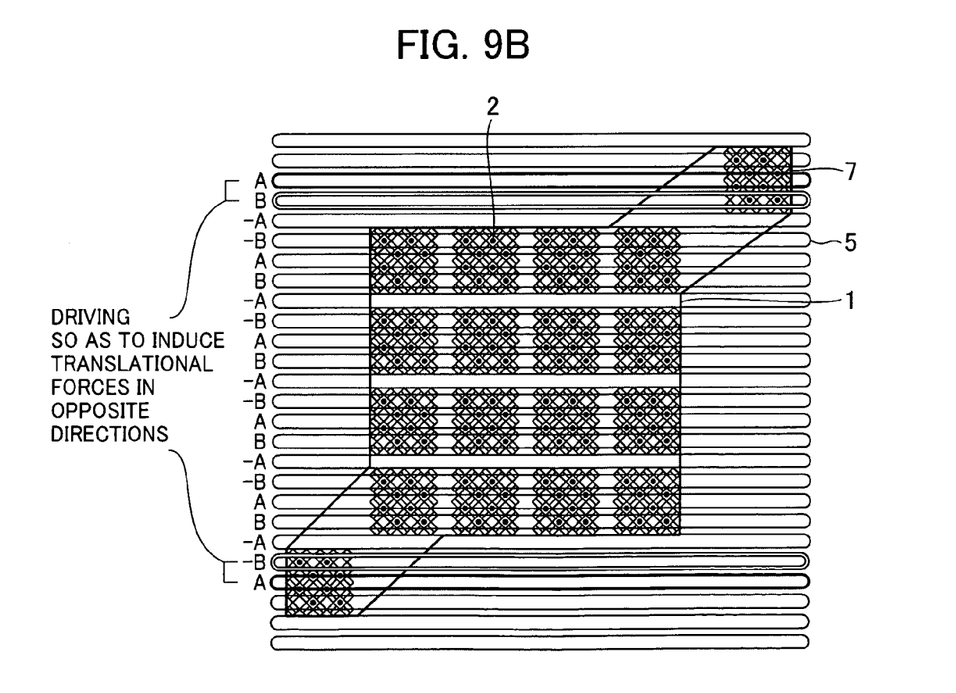

FIGS. 9A to 9B illustrate views which show a configuration of coils and permanent magnets discussed in the Japanese Patent Laid-Open No. 2004-254489, as viewed from above in FIGS. 8A and 8B, and in which the stage is shown being see-through in order to facilitate the understanding of the configuration thereof. A plurality of coils 5 having linear portions in the X-axial direction are arranged in the Y-axial direction, and current having predetermined phases are fed to those of the coils 5 which are located underneath the magnets so as to displace the stage in the Y-axial direction. Further, with the provision of a plurality of coils having linear portions in the Y-axial direction, which are arranged in the X-axial direction, the stage can be displaced in the X-axial direction. It is noted here that the magnet unit 2 has such a magnetic configuration that the Halbach array has deficient parts 6 from which permanent magnets are in part removed as shown in FIG. 9A, or the Halbach array has additional parts in which permanent magnets are in part added 7 as shown in FIG. 9B. With this magnet configuration, currents are fed to coils underneath a pair of deficient parts 6 or additional parts 7 so as to induce forces in reverse direction, respectively therefrom, so as to cause the stage 1 to displace in the θz direction (a rotational direction around the Z-axis).

As illustrated in FIG. 9A, if defective portions are provided in permanent magnets having an array sequence, permanent magnets used for X- and Y-axial displacements can be removed, resulting in decreased drive efficiency. As illustrated in FIG. 9B, if additional portions are provided in permanent magnets having an array sequence, separates Coils for θz drive can be used in addition to coils for X- and Y-axial drives in order to increase efficiency of the drive. In this case, since a current applied for the θz drive is different from currents applied for the X- or Y-axial drive, different current drives can be used, that is, an increase in the number of current drivers results in increased costs. Further, since the additional magnets overhang outward by a large degree, the stage itself would have a larger size, the larger the carriage, the larger the apparatus and as well the larger the heating value of a drive unit, resulting in difficulty in maintaining increased accuracy.

SUMMARY OF THE INVENTION

At least one exemplary embodiment is directed to a positioning apparatus for positioning an original to be exposed, a matter to be exposed, or positioning a test object to a predetermined position.

At least one exemplary embodiment is directed to a positioning apparatus including a movable member having a plurality of magnets, a plurality of coils arranged in X- and Y-axial directions, for displacing the movable member in these directions. The plurality of magnets constitute a first magnet unit for generating forces in X- and Y-axial directions, and a second magnet unit for generating a force in a direction around the Z-axis. The second magnetic unit being provided so as to cause at least a part of coils for generating a force in the X-axial direction to generate a force in a rotating direction around the Z-axis, while reducing generation of a force in the Y-axial direction. Incidentally, the X- and Y-axial directions can be used for defining two orthogonal directions in one and the same plane, are synonymous with a first direction and a second direction orthogonal the first direction.

Further, the second magnet unit can include a plurality of magnets which, in at least one exemplary embodiment, are configured so that N-poles and S-poles are alternately arranged in the X-axial direction. The first magnetic unit can include a plurality of magnets, where in at least one exemplary embodiment are configured so that N-poles and S-poles are alternately arranged in X- and Y-axial directions. It is noted here that "the plurality of magnets configured so that N-poles and S-poles are alternately arranged", are those which are located so that the polarities of N-poles and S-poles are alternately opposed to coil units.

At least one further exemplary embodiment is directed to a positioning apparatus for displacing a movable member with the use of magnets and coils, at least two dimensionally, which is movable in a rotational direction while (1) increasing the drive efficiency, and/or (2) decreasing of the size of the movable member and/or (3) decreasing the cost.

Further features of the present invention will become apparent from the following description of exemplary embodiments (with reference to the attached drawings).

DESCRIPTION OF THE EMBODIMENTS

The following description of at least one exemplary embodiment is merely illustrative in nature and is in no way intended to limit the invention, its application, or uses.

Processes, techniques, apparatus, and materials as known by one of ordinary skill in the art may not be discussed in detail but are intended to be part of the enabling description where appropriate. For example magnets are discussed and any material that can be used to form elements of the magnets should fall within the scope of exemplary embodiments (e.g., iron).

Additionally the actual size of the elements of exemplary embodiments may not be discussed, however any size from macro to micro and nano are intended to lie within the scope of exemplary embodiments (e.g., magnets with diameters of nanometer size, micro size, centimeter, and meter sizes). Additionally exemplary embodiments are not limited to moving wafer stages in exposure systems, for example the system can be designed for use in moving units between stages in a fabrication process.

Examples of several exemplary embodiments are described below with reference to the accompanying drawings.

Exemplary Embodiment 1

Referring to FIG. 8A which is a top view illustrating a stage unit in an exemplary embodiment 1 and FIG. 8B which is a sectional view illustrating the stage unit as viewed sidewise, a stage (movable member) 1 carrying thereon an object to be positioned, is movable in X- and Y-axial directions on a base member 3. The stage 1 has, at its bottom surface, a magnetic unit 2 which will be described later. The base member 3 has, at its surface opposing the magnetic unit 2, serving a platen as a whole. The coil unit 4 has a first coil layer in which a plurality of coils are arranged in an X-axial direction, each coil having a linear portion in a Y-axial direction so that its longitudinal direction is laid in the Y-axial direction. Underneath the first coil layer (downward in a minus Z-axial direction, into the page), there is a second coil layer in which a plurality of coils are arranged in Y-axial direction, each coil having a linear portion in the X-axial direction so that its longitudinal direction is laid in the X-axial direction. Further, in accordance with the exemplary embodiment, the coil unit 4 can include additional coil layers in which coils are arranged, each having a linear portion in a predetermined direction. The coils can be secured to the base member 3, and the coil unit 4 can be covered thereover with a jacket which is not shown. With this configuration, heat which is generated when current is fed to the coil can be cooled by feeding coolant through the jacket or by arranging cooling pipes among the coils, or by hollow coils where coolant flows through the center of the hollow coils.

Figure 1:
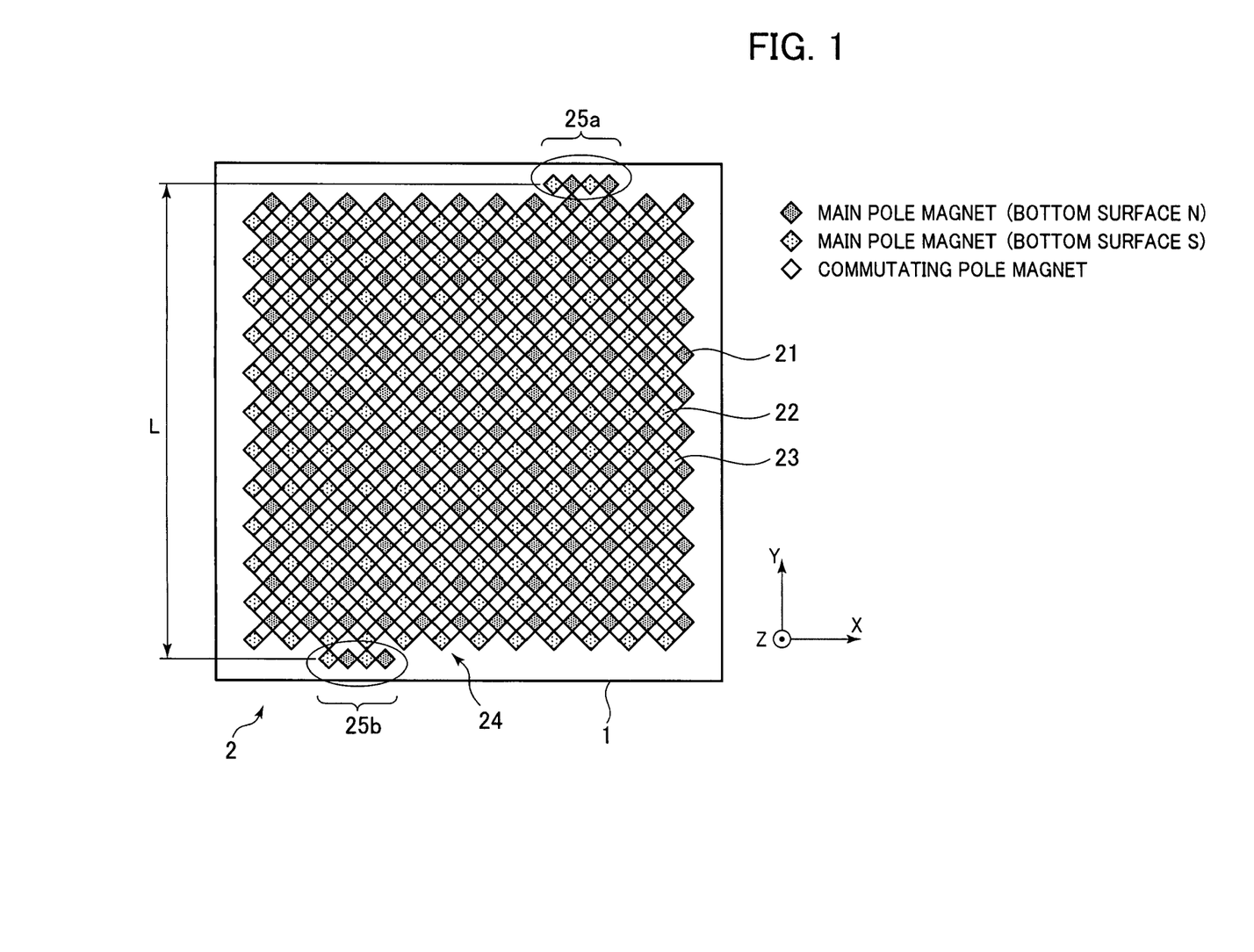
FIG. 1 is a plane view illustrating a magnet configuration of a surface motor type wafer stage in accordance with at least one exemplary embodiment.

FIG. 1 is a top view illustrating the stage as see-through in order to facilitate the understanding of the configuration of magnets arranged at the bottom surface of the stage. Magnets 21 in FIG. 1 are main-pole magnets which are magnetized in the Z-axial (perpendicular) direction, having N-poles on the −Z side (the bottom surface of the stage). Magnets 22 are main pole magnets 22 which are magnetized in the Z-axial direction, having S-poles in the −Z side. Magnets 23 are commutating pole magnets which are magnetized in a horizontal direction (e.g., along the X-Y plane), and are arranged so that poles at their ends are coincident with that of the main pole magnets adjacent thereto, as viewed from the bottom surface. That is, the so-called Halbach array is two-dimensionally formed in the X- and Y-axial directions. Note that exemplary embodiments are not limited to the magnets being arranged in a Halbach array. Such a discussion is meant for illustrative non limiting purposes.

Thus, in such a Halbach array, the magnets 22, 23 are symmetrically arranged in the X- and Y-axial directions so as to form a magnet unit 24 which is substantially square as a whole. Magnet units 25a, 25b are arranged on both sides of the magnet unit 24 as viewed in the X-axial direction, in the non-limiting example illustrated each includes four magnets which are arranged in a row so as that S-poles and N-pole are opposed to the coil unit 4, S-poles and N-pole being alternately set in the X-axial direction. Note any number besides four can be used in at least one exemplary embodiment. The magnet units 25a and 25b can be provided in pair, being spaced from each other by a distance L in the Y-axial direction, that is, the magnet unit 24 is interposed therebetween in the Y-axial direction.

Figure 2:
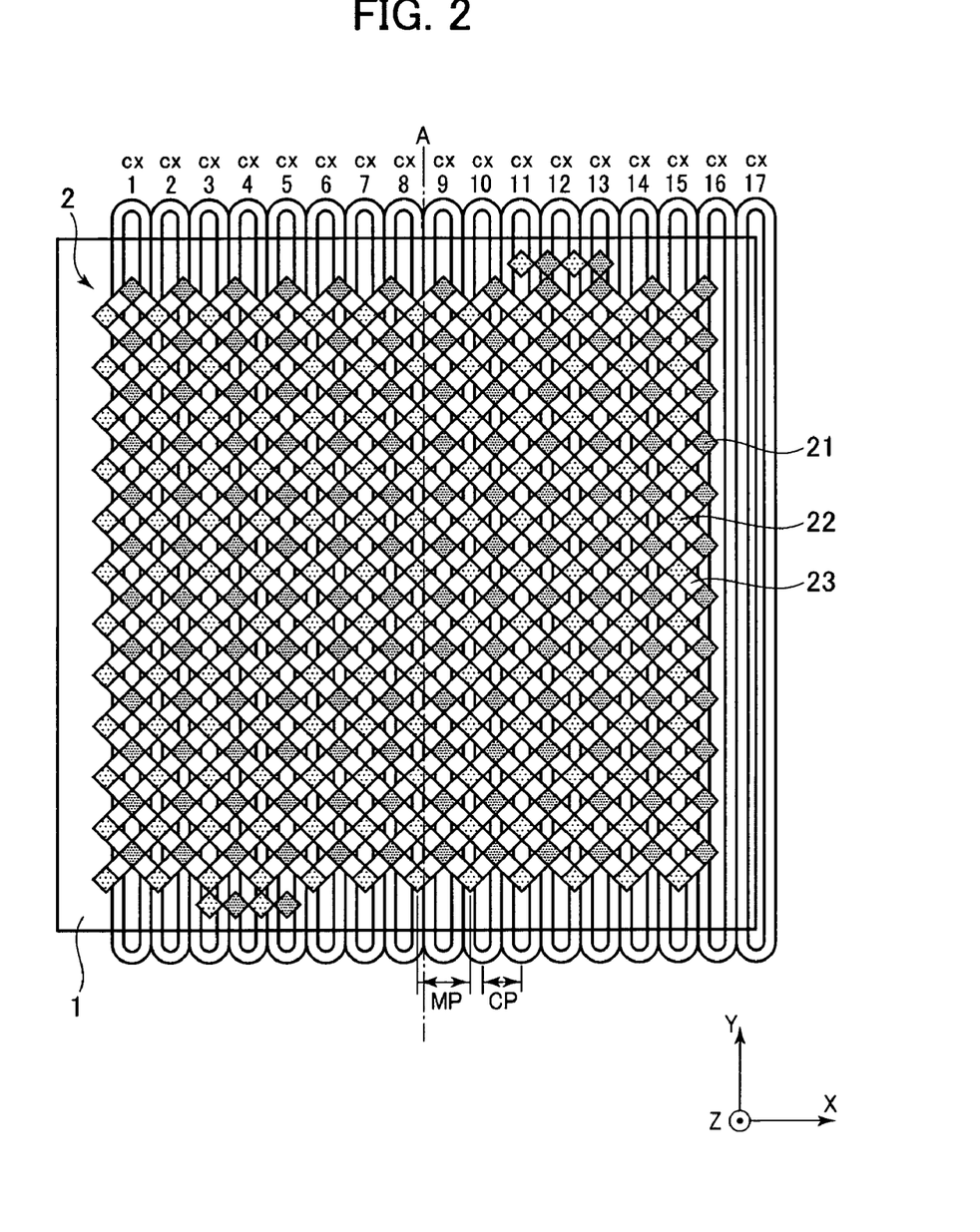
FIG. 2 is a plane view illustrating a positional relationship between a magnetic unit and a coil unit during movement in an X-axial direction.

Explanation will be made of a positional relationship between the magnet unit 2 and the coil unit 4. Referring to FIG. 2 in which the second coil layer is not shown but only the first coil layer is shown. Further, long length coils can be arranged in order to displace the stage in the X- and Y-axial directions by long strokes, the coils shown in FIG. 2 have a short-length in order to facilitate the explanation thereof. Further, the coils are shown by a number (e.g., CX1-CX17) which is less than the total number thereof in order to facilitate the explanation thereof.

Explanation will be hereinbelow made of a manner of displacing the stage in the X-axial direction with reference to FIG. 2.

The coils are arranged in the X-axial direction at pitches CP, and in the magnet unit 24 (FIG. 1), the magnets having one and the same poles are arranged in the X-axial direction at pitches MP. It is noted here that the pitches CP and MP can vary and in at least one exemplary embodiment satisfies the following equation;

$$MP = 4/3 * CP \quad (1)$$

Magnetic fluxes produced by the magnets in the coil unit 24 (FIG. 1) of the stage exhibit a magnetic flux density distribution having a predetermined period. If the magnets are in the Halbach array, an averaged value of the magnetic flux density distribution in the Z-axial direction at the position of the coil unit can be approximated to a sinusoidal wave substantially having a period MP with respect to the X-axis.

Referring to FIG. 2, when the stage located at an X-axial position x=0 is displaced in a range 0<x<CP, a thrust fi (i=2 to 15) which is induced in the X-axial direction from a coil cxi (i-th coil from the left side of the figure) fed thereto with a current Ii [A] is exhibited by the following functions:

$$f2, f6, f10, f14 = -Ii*Ki*\cos(2*\pi/MP*x) \quad (2)$$

$$f4, f8, f12 = Ii*Ki*\cos(2*\pi/MP*x) \quad (3)$$

$$f3, f7, f11, f15 = Ii*Ki*\sin(2*\pi/MP*x) \quad (4)$$

$$f5, f9, f13 = -Ii*Ki*\sin(2*\pi/MP*x) \quad (5)$$

where Ki is a constant. It is noted that the value Ki is slightly different for f4, f5, f12, f13 from those for the other thrusts induced by the other coils, these differences can be negligible (Ki~K) in view of the control of macro movements.

Further, if a current Ii (i=2 to 15) is fed to a coil cxi (i-th coil from the left side in the figure) as follows:

$$I2, I6, I10, I14 = -I^* \cos(2^*\pi/MP^*x) \quad (6)$$

$$I4, I8, I12 = I^* \cos(2^*\pi/MP^*x) \quad (7)$$

$$I3, I7, I11, I15 = I^* \sin(2^*\pi/MP^*x) \quad (8)$$

$$I5, I9, I13 = -I^* \sin(2^*\pi/MP^*x) \quad (9)$$

a resultant force (f2+f3) is exhibited by:

$$(f2+f3) = I^*K^* \cos^2(2^*\pi/MP^*x) + I^*K^* \sin^2(2^*\pi/MP^*x)$$
$$= I^*K \quad (10)$$

Further, for every y resultant force (f4+f5), (f5+f7), (f8+f9), (f10+f11), (f12+f13) and (f14+f15), I*K can be similarly obtained, and accordingly, 7*I*K is obtained as the total resultant force. That is, whenever there is a desire to induce a force F, the current I can be set to:

$$I = F/7K \quad (11)$$

A laser interferometer which is not shown can be used in order to measure a position x of the stage. It should be noted here that the phase of the current Ii is set so as to be coincident with that of the magnetic density distribution. That is, a measured value obtained by the laser interferometer can be used as a feed-back signal for the position control of the stage, and used to compute a phase of the above-mentioned current.

Figure 4:
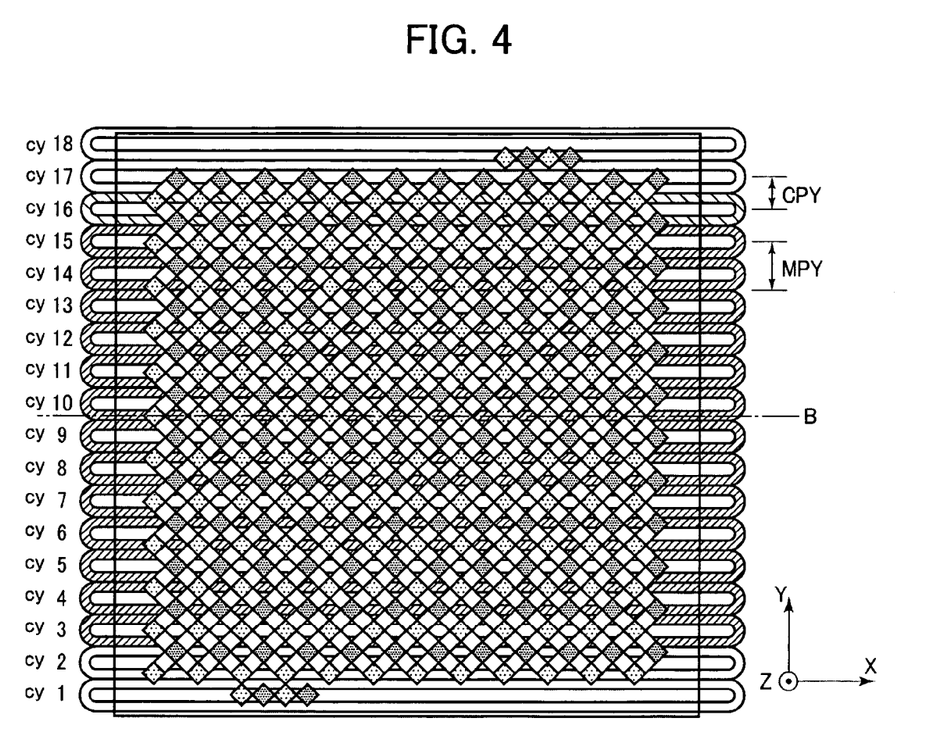
FIG. 4 is a plane view illustrating a positional relationship between a magnetic unit and a coil unit during movement in a Y-axial direction.

A manner of displacing the stage in the Y-axial direction is carried out, similar to that for displacing the stage in the X-axial direction. That is, by measuring a position of the stage in the Y-axial direction, and predetermined currents are fed to coils in the second coil layer so as to induce a predetermined thrust in the Y-axial direction. Referring to FIG. 4 which shows only the second coil layer without the first coil layer. Further, several coils having a long length should be arranged in order to displace the stages in the X- and Y-axial directions by a long stroke, coils having a shorter length are shown by a number less than the number in FIG. 4 in order to facilitate the explanation thereof.

The coils (e.g., CY1-CY18) are arranged in the Y-axial direction at pitches CPY, and in the magnetic unit 24, the magnets having the one and the same pole are arranged in the Y-axial direction at pitches MP which are set as follows;

$$MPY = 4/3^*CPY \quad (1)$$

Magnetic fluxes generated by the magnets in the magnet unit 24 (FIG. 1) of the stage exhibit a magnetic flux density distribution having a predetermined period at the position of the coil unit. Since the magnets are arranged in a Halbach array, an averaged value of the magnetic flux density distribution in the Z-axial direction at the position of the coil unit, can be approximated to a sinusoidal wave substantially having a period MPY. It is note here that the Halbach array is two-dimensionally formed so as to cause difference in the magnetic flux density distribution among coil parts, and accordingly, "the averaged value of the magnetic flux density distribution" is used.

A manner of displacing the stage in the Z-axial direction is similar as mentioned above, except that a phase of current fed to each coil is different from that for the displacement in the X- and Y-axial direction by 90 deg. By shifting the phase by 90 deg. a Z-axial thrust can be induced between the magnetic unit at the bottom surface of the stage and the first coil layer or the second coil layer.

In order to displace the stage in the Z-axial direction with the first coil layer, acertain number of coils can be chosen, for example twelve (12) coils cx3 to cx14. In the case of using 12 coils, the current value I for inducing a thrust F can be set to a value obtained by multiplying (F/Kz/6) with a phase of each coil, where Kz is a coefficient.

Explanation will be hereinbelow made of displacement of the stage in a θx direction (rotational direction around the X-axis) or a θy direction (rotational direction around the Y-axis).

Referring to FIG. 2, a thrust in the −Z-axial direction is induced with the use of the coils in the stage on the left side (−X side) of the center line A while a thrust in the +Z-axial direction is induced with the use of the coils in the stage on the right side (+X side) of the center line A, and accordingly, a thrust in the θy direction can be induced in the stage.

Similarly (FIG. 4), a thrust in the +Z-axial direction can be induced with the use of the cols in the stage on the upper side (+Y side) of the center line B while a thrust in the −Z-axial direction can be induced with the use of the coils in the stage on the lower side (−Y side) of the center line B, and accordingly, a thrust in the θx direction can be induced in the stage.

The positions of the stage in the θx and θy directions can be measured by providing two optical axes of laser interferometers for measuring positions respectively in the Y- and X-axial directions, which are spaced in the Z-axial direction. Specifically, it can be obtained by dividing a difference between measured values along the two optical axes with the space between two optical axes in the Z-axial direction.

As stated above, in order to induce thrusts in the X-, Y- and Z-axial directions, and in the θx and θy directions, the magnet unit 24 (FIG. 1) in which the magnets are arranged in the Halbach array is used. It is noted that the magnets are tightly laid in the magnet unit in a square shape in order to enhance the thrust efficiency, although any shape is in accordance with exemplary embodiments.

Figure 3:
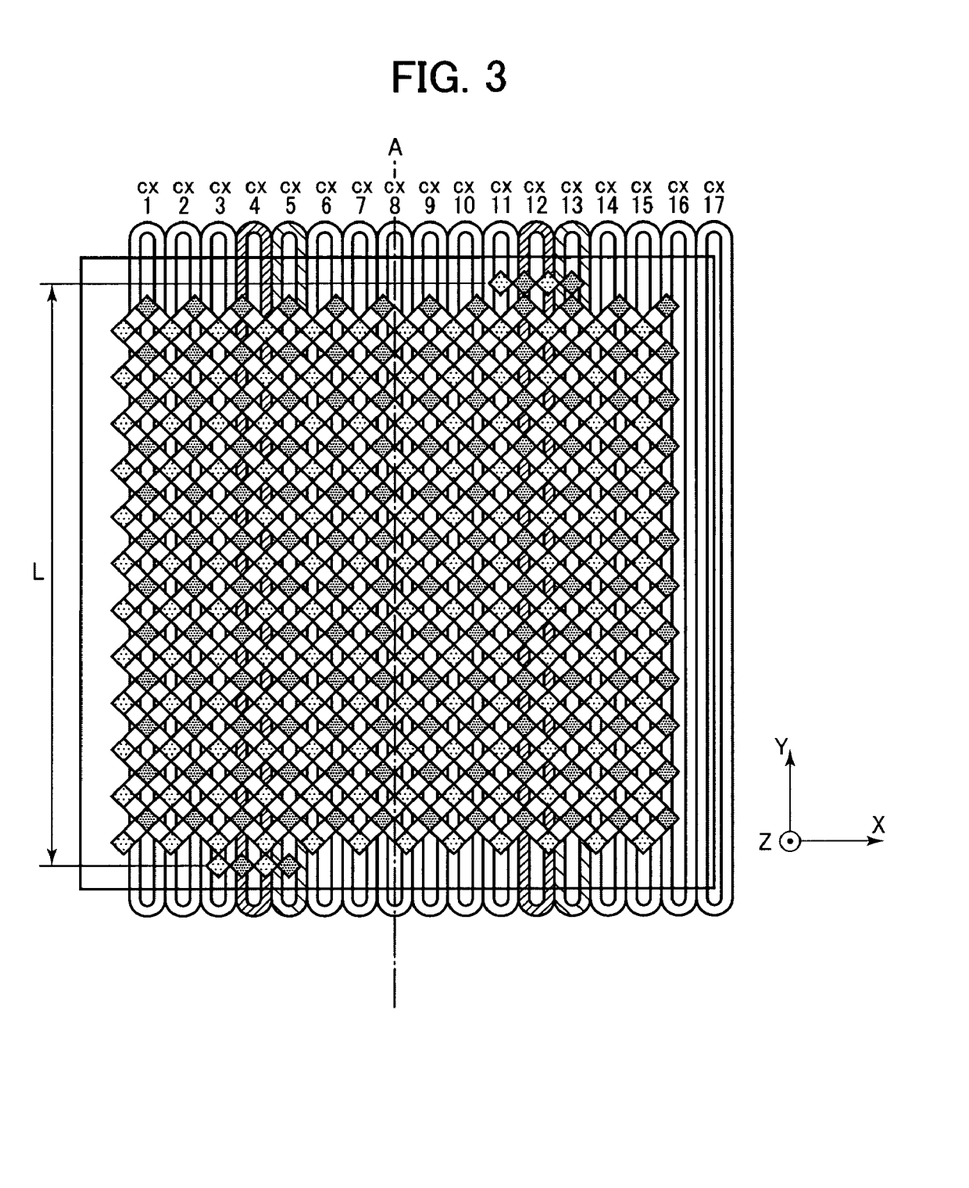
FIG. 3 is a plane view illustrating a positional relationship between a magnetic unit and a coil unit during movement in a θz direction.

Next, explanation will be made of a manner of displacing the stage in a θz direction with reference to FIG. 3. In order to induce a thrust in the θz direction in the stage, coils cx4, cx5, cx12 and cx13 located underneath the magnetic units 25a, 25b are used.

When current I'i [A] is fed to each coil, thrusts f'4, f'5, f'12, f'13 in the X-axial direction are exhibited as follows:

$$f'4, f'12 = I'i^*K'^* \cos(2^*\pi/MP^*x) \quad (12)$$

$$f'5, f'13 = -I'i^*K'^* \sin(2^*\pi/MP^*x) \quad (13)$$

where K' is a constant and the differences between K' values between coils is deemed negligible. Further, currents I'4, I'5, I'12, I'13 fed to the coils (cx4, cx5, cx12 and cx13) are set as follows:

$$I'4 = I^* \cos(2^*\pi/MP^*x) \quad (14)$$

$$I'5 = -I^* \sin(2^*\pi/MP^*x) \quad (15)$$

$$I'12 = -I^* \cos(2^*\pi/MP^*x) \quad (16)$$

$$I'13 = I^* \sin(2^*\pi/MP^*x) \quad (17)$$

That is, if the current values fed to the coils cx12, cx13 are set to values obtained by multiplying the current values fed to the coils cx4, cx4 with −I, resultant force (f'4+f'5) and (f12+f13) are exhibited as follows:

$$f'4+f'5=I'^*K'^*\cos^2(2^*\pi/MP^*x)+I'^*K'^*\sin^2(2^*\pi/MP^*x)=I'^*K' \quad (18)$$

$$f'12+f'13=-I'^*(K'^*\cos^2(2^*\pi/MP^*x)+K'^*\sin^2(2^*\pi/MP^*x))=I'^*K' \quad (19)$$

Since the magnet units 25a, 25b are spaced from each other in the Y-axial direction by the distance L, the stage is driven by the thrusts exhibited by the formulae (18) and (19) with the use of respective different coils. These thrusts act upon the stage as a couple of forces, and accordingly, a moment θzm in the θz direction, acting upon the stage, is exhibited as follows:

$$\theta zm=I'^*L^*K' \quad (20)$$

That is, in order to induce a moment having a value Mz, a current value:

$$I'=\theta zm/LK' \quad (21)$$

is set in the formulae (14) to (17).

In order to control the position of the stage, the sum of the current value I for the thrust in the X-axial direction and the current value I' for the thrust in the θz direction is fed as a current instruction value to the coils cx4, cx5, cx12 and cx13. Thus, the coils are used for both thrust in the X-axial direction and thrust in the θz direction, and accordingly, it is possible to reduce the provision of an additional current driver for a thrust in the θz direction.

In FIG. 4, current is fed to coils cy3 to cy16 in order to induce thrusts in the Y-axial direction and the θx direction. Since in the non-limiting example discussed no current is fed to coils cy1, cy18 located underneath the magnet units 25a, 25b, no forces are induced between the coils and the magnet units 25a, 25b. Further, in each of the magnet units 25a, 25b, four magnets can be arranged in a single row in the X-axial direction so that N-poles and S-poles are alternately opposed to the coil unit while a force induced by a magnetic flux from an N-pole magnet is set to be equal to that from an S-pole magnet. Thus, even though currents run through the coils cy1, cy18, the action of forces by these currents and the magnets in the θz magnet units can be cancelled out as internal forces, and accordingly, nothing is affected to a rigid-body motion applied to the stage. That is, the magnet units 25a, 25b are provided so that those coils which induce forces in the X-axial direction induce forces in the rotational direction around the Z-axis but those coils which induce forces in the Y-axial direction do not induce forces in the rotational direction around the Z-axis.

Such a case that the stage is displaced in the X-axial direction by one pitch CP so that its coordinate comes to x=CP, is analogous to such a condition that an (n+1)-th coil is located at the position of an N-th coil at X=0. Thus, by iterating the drive manner which has been explained hereinabove with periods of the coil pitches CP and CPY, a desired thrust can be induced at an arbitrary stage position. In this exemplary embodiment, although the magnet units 25a, 25b are arranged so as to interpose the magnet unit 24 therebetween in the Y-axial direction, there can also used such a configuration that a single magnet unit 25 can be arranged on one side of the magnet unit 24. In this configuration, the moment θzm in the θz direction induced in the stage is exhibited as follows;

$$\theta zm=0.5^*I'^*L^*K' \quad (22)$$

It is noted that the formula 22 can be satisfied if the gravitational center of the stage is located at the center of the stage. If the gravitational center position of the stage is deviated from the stage center, it is sufficient to add the deviation as a correction value in the moment calculation. Further, in the case of an arrangement of the magnet unit only on one side, since only one of the formulae (18) and (19) gives a thrust, no couple of forces are induced so that a thrust is induced in the X-axial direction by a current for inducing a thrust in the θz direction. Such a thrust can be managed by a current value for inducing a thrust in the X-axial direction.

The magnet units 25a, 25b can be arranged on the left and right sides of the center line A as shown in FIG. 2, and further, they can be arranged to be left-right symmetric. Further, if a large moment force is desired, plural pairs of magnet units (e.g., 25a and 25b) can be provided, rather than one pair.

With the use of the stage configuration according to at least one exemplary embodiment, since the coils are used for both drive in a horizontal direction and drive in the θz direction, it is possible to reduce the provision of an additional current driver for the drive in the θz direction. Thus, the stage can be small-sized, and accordingly, an exposure device can be also small-sized as a whole. Further, in order to induce thrusts in the X-, Y- and Z-axial directions and the θx and θy directions, the magnets in the Halbach array can be tightly laid in a square shape with no missing, thereby it is possible to enhance the efficiency for inducing the thrusts.

It is noted that although the thrust in the θz direction is induced in the stage by the first coil layer, according to at least one exemplary embodiment, the thrust in the θz direction can be induced by the second coil layer. In this case, the magnet units 25a, 25b are arranged so as to interpose therebetween the magnet unit 24 in the X-axial direction.

(Example of an Exposure Device)

Figure 5:
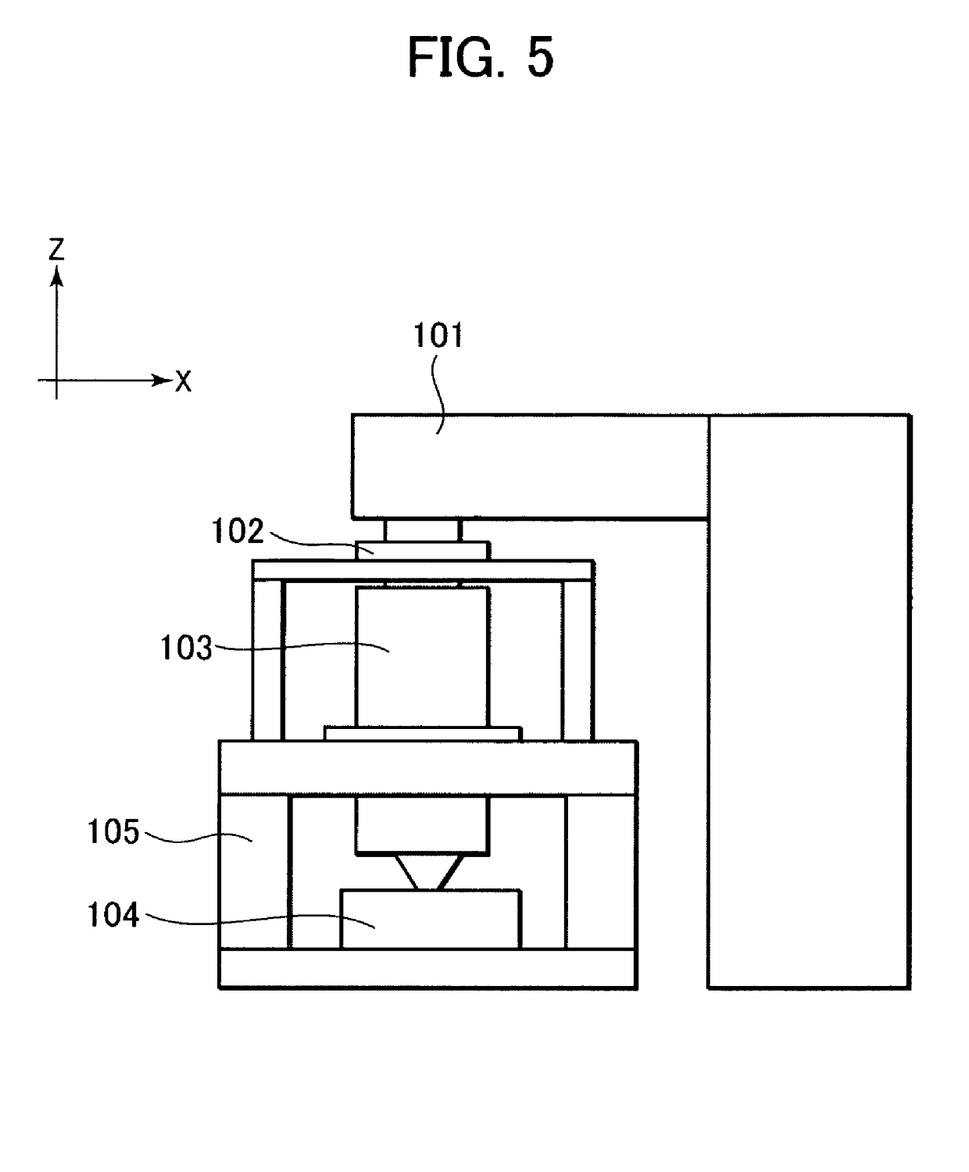
FIG. 5 is a side view illustrating an exposure device.

Referring to FIG. 5 which illustrates an exposure device for manufacturing a semiconductor device using a stage unit similar to that mentioned above, as a wafer stage. The exposure device can be used for manufacturing a device formed from a fine pattern, for example, a semiconductor device (e.g., a semiconductor integrated circuit, a micro machine, a thin film magnetic head, other pattern formed devices both macro, micro, and nano in size as known by one of ordinary skill in the relevant art and equivalents). An exposure beam (e.g., a visible light beam, an ultraviolet beam, an EUV beam, an X-ray radiation, an electron beam and other exposure beams as known by one of ordinary skill in the relevant arts and equivalents) from an illumination system unit 101, irradiates, after passing through a reticle with an original pattern and via a projection lens 103 (e.g., a refractive lens, a reflection lens, a catadioptric lens system, a charged particle lens and other projection lens systems as known by one of ordinary skill in the relevant arts and equivalents), a semiconductor wafer (substrate) forming a pattern of the original on the substrate, which can be mounted on the wafer stage 104. Further, in such an exposure device, as the wavelength of the exposure beam becomes shorter, exposure has been carried out more in a vacuum environment. A wafer (an object to be irradiated) as a substrate is held on a chuck installed on the wafer stage 104, and a a reticle containing an original (i.e., an original pattern) to be exposed is mounted on a reticle stage 102 and is illuminated to transferred onto one of zones on the wafer in a step-and-repeat mode or a step-and-scan mode by the illumination system unit 101. It is noted here that the above-mentioned movement of the stage in exemplary embodiments can be used to move the wafer stage 104 or the reticle stage 102.

(An Example of a Method of Manufacturing a Device)

Figure 6:
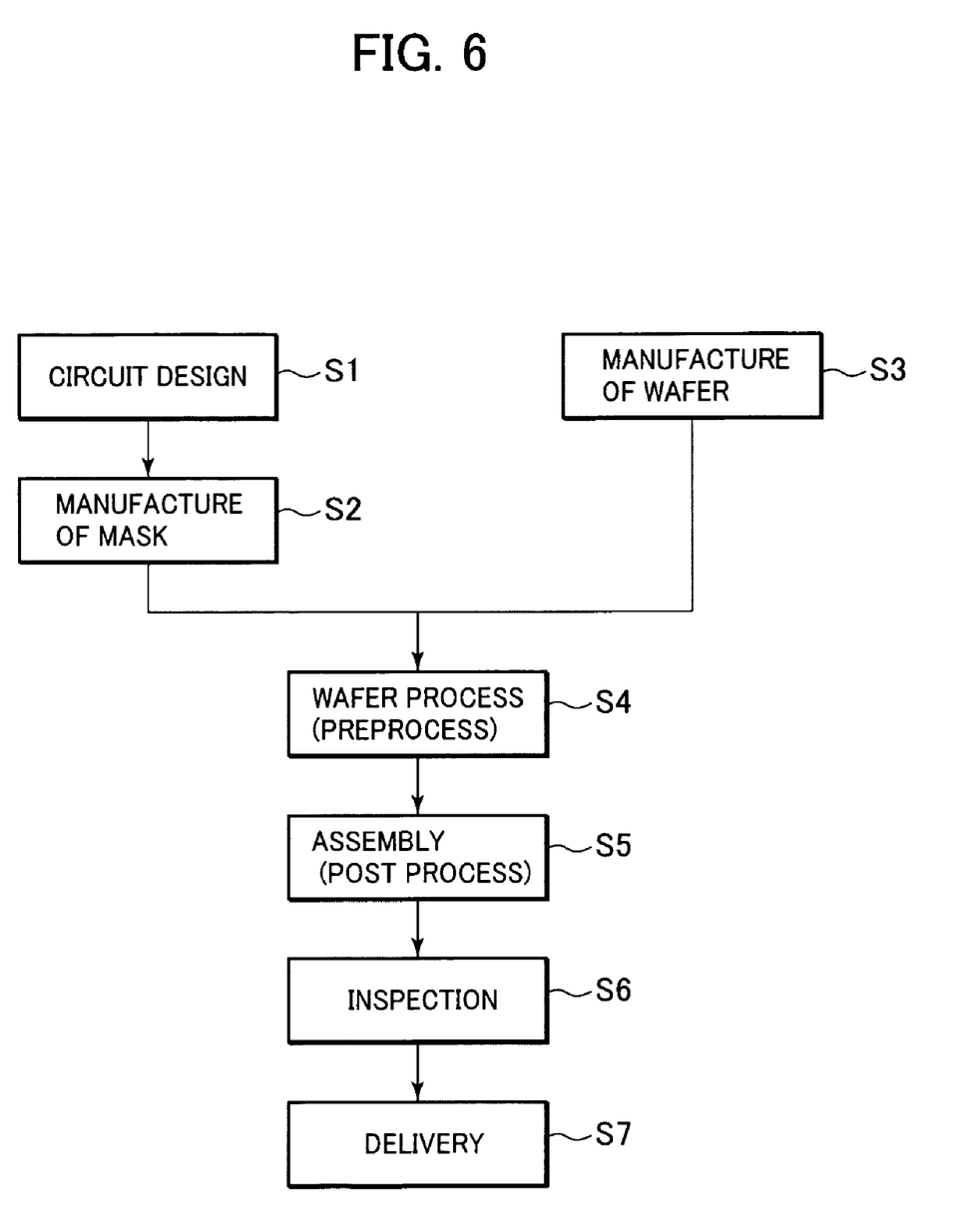
FIG. 6 illustrates a view for explaining a device manufacturing method.

Next, explanation will be made of a process of manufacturing a semiconductor device with the use of the above-mentioned exposure device illustrated in FIG. 5. FIG. 6 is a view illustrating a flow-chart for explaining a process of manufacturing a semiconductor device. At step 1 (S1) (circuit design), a circuit design for a semiconductor device is carried out. At step 2 (S2) (manufacture of a mask), a mask is formed in accordance with the designed circuit pattern.

Meanwhile, at step 3 (S3) (manufacture of a wafer), a wafer is manufactured with the use of a material (e.g., silicon). Step 4 (S4) (wafer process) as the so-called pre-process, an actual circuit is formed on the wafer with the use of the mask and the wafer as mentioned above (e.g., by using lithography technology using the above-mentioned exposure device). The next step 5 (S5) (assembly) is the so-called post-process, a semiconductor chip is obtained with the use of the wafer manufactured by the step 4 (S4), this step 5 (S5) can include an assembling step which can include an assembly step (dicing, bonding), and a package step (chip enclosure). At step 6 (S6) (inspection), an inspection including an operation confirming test, and a duration test is carried out for the semiconductor device manufactured at step 5 (S5). Through the above-mentioned steps, the semiconductor device is completed. Thus, at step 7 (S7), the semiconductor device is delivered.

Figure 7:
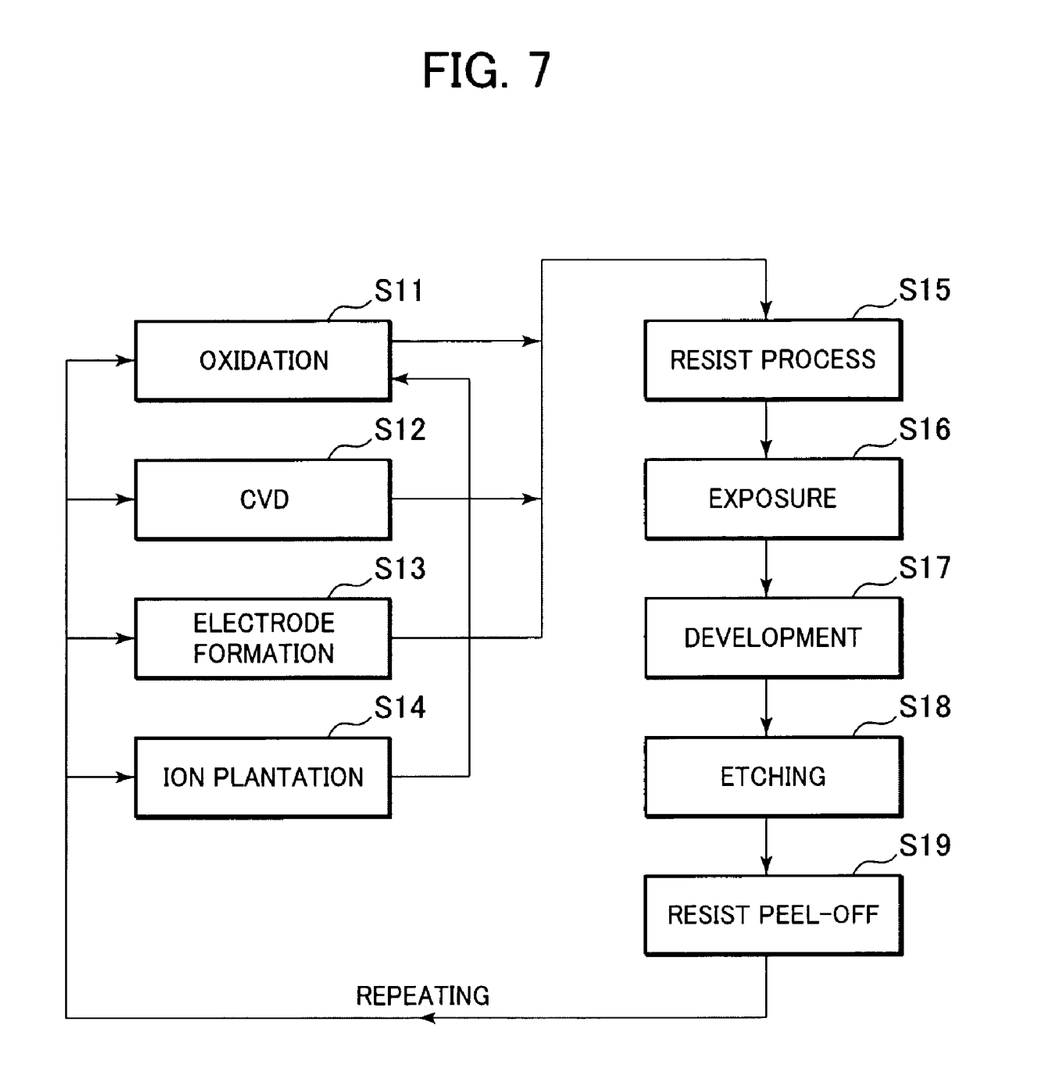
FIG. 7 illustrates a view for explaining a wafer process.

The wafer process at the above-mentioned step 4 (S4) can include the following steps (FIG. 7): a CVD step (S12) of forming an insulation film on the outer surface of the wafer, an electrode forming step (S13) of forming electrodes on the wafer by vapor deposition, an ion implantation step (S14) of implanting ions in the wafer and subsequent oxidation (S11), a resist process step (S15) of coating a photo-sensitive material on the wafer, an exposure step (S16) of transferring a circuit pattern by the exposure device onto the wafer after the resist process step, a developing step (S17) of developing the wafer exposed at the exposure step, an etching step (S18) of grinding a part other than the resist image developed at the developing step, and a resist peel-off step (S19) of removing the resist after the etching. With the repetitions of the above-mentioned steps, circuit pattern in multi-layers are formed on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Laid-Open No.2004-323759, filed Nov. 8, 2004, which is hereby incorporated by reference herein in its entirety.

What is claimed is:

1. A positioning apparatus, configured for moving a movable member relative to base member by a surface motor, comprising:
   a first coil unit including plurality of coils which are arranged in an X-axial direction and which have a longer length in a Y-axial direction than in the X-axial direction,
   wherein an X-axis is perpendicular to a Y-axis;
   a second coil unit including a plurality of coils which are arranged in the Y-axial direction and which have a longer length in the X-axial direction than in the Y-direction;
   a first magnet unit configured to generate a force to the movable member in the X-axial direction in cooperation with the first coil unit and to generate a force to the movable member in the Y-axial direction in cooperation with the second coil unit; and
   a second magnet unit configured to generate a force to the movable member in a rotational direction around a Z-axis in cooperation with either the first coil unit or the second coil unit, wherein the Z-axis is perpendicular to both of the X-axis and the Y-axis.

2. A positioning apparatus according to claim 1, wherein the second magnet unit is provided on each of opposite sides of the first magnet unit.

3. A positioning apparatus according to claim 1, wherein the second magnet unit includes a plurality of magnets arranged in a row, and the plurality of magnets exhibits a periodic magnetic flux density distribution.

4. A positioning apparatus according to claim 1, wherein the first magnet unit includes a plurality of magnets arranged two-dimensionally, and the plurality of magnets exhibit a periodic magnetic flux density distribution.

5. An exposure device for exposing a pattern onto a substrate, comprising:
   an illumination system unit;
   a projection lens;
   a reticle stage; and
   a wafer stage configured to hold a substrate, the substrate being positioned on the wafer stage using a positioning apparatus, the positioning apparatus configured for moving a movable member relative to base member by a surface motor, and including a first magnet unit configured to generate a force to the movable member in an X- and Y-axial direction, a second magnet unit configured to generate a force to the movable member in a rotational direction around a Z-axis, a first coil unit configured to generate a force at least in the X-axial direction in the movable member, and a second coil unit configured to generate a force at least in the Y-axial direction around the Z-axial direction between itself and either the first or second coil unit, wherein an exposure beam is provided by the illumination system unit, and the exposure beam irradiates, after passing through a reticle mounted on a reticle stage, the recticle containing an original pattern and via the projection lens, the substrate forming a pattern of an original pattern on the substrate.

6. A positioning apparatus according to claim 1,
   wherein a second magnet unit configured to generate a force to the movable member in a rotational direction around a Z-axis in cooperation with the first coil unit,
   wherein the first magnet unit and the second magnet unit are arranged on the movable member so as to be opposed to the base member,
   wherein the first coil unit and the second coil unit are provided on the base member, being displaced in the Z-axial direction,
   wherein the first magnet unit includes a plurality of row magnets arranged along either the X-axial direction or the Y-axial direction one-dimensionally with periodicity, and
   wherein the row magnets are arranged on both sides of the first magnet unit in said Y-axial direction.

* * * * *